US010336609B2

(12) United States Patent
Watanabe et al.

(10) Patent No.: US 10,336,609 B2
(45) Date of Patent: Jul. 2, 2019

(54) MICROSTRUCTURE PROCESSING METHOD AND MICROSTRUCTURE PROCESSING APPARATUS

(71) Applicant: HITACHI, LTD., Tokyo (JP)

(72) Inventors: Keiji Watanabe, Tokyo (JP); Shuntaro Machida, Tokyo (JP); Katsuya Miura, Tokyo (JP); Aki Takei, Tokyo (JP); Tetsufumi Kawamura, Tokyo (JP); Nobuyuki Sugii, Tokyo (JP); Daisuke Ryuzaki, Tokyo (JP)

(73) Assignee: Hitachi, Ltd., Tokyo (JP)

( * ) Notice: Subject to any disclaimer, the term of this patent is extended or adjusted under 35 U.S.C. 154(b) by 0 days.

(21) Appl. No.: 15/610,987

(22) Filed: Jun. 1, 2017

(65) Prior Publication Data
US 2017/0362082 A1    Dec. 21, 2017

(30) Foreign Application Priority Data

Jun. 16, 2016  (JP) ................................. 2016-119491

(51) Int. Cl.
B81C 1/00 (2006.01)
B05D 3/06 (2006.01)
B81C 99/00 (2010.01)

(52) U.S. Cl.
CPC .......... B81C 1/00531 (2013.01); B05D 3/064 (2013.01); B81C 99/0025 (2013.01); B81C 2201/0132 (2013.01); B81C 2201/0136 (2013.01); B81C 2201/0143 (2013.01); Y10S 148/042 (2013.01); Y10S 438/924 (2013.01)

(58) Field of Classification Search
None
See application file for complete search history.

(56) References Cited

U.S. PATENT DOCUMENTS 5,683,547 A * 11/1997 Azuma ............... H01J 37/3056
216/37
2002/0081507 A1 6/2002 Kaito
2010/0203431 A1* 8/2010 Bret ......................... C23F 4/00
430/5

(Continued)

FOREIGN PATENT DOCUMENTS

DE    10 2013 101 257 A1    8/2013

OTHER PUBLICATIONS

German Office Action received in corresponding German Application No. 10 2017 209 699.3 dated Aug. 3, 2018.

Primary Examiner — Stephanie P Duclair
(74) Attorney, Agent, or Firm — Mattingly & Malur, PC

(57) ABSTRACT

First, an ion beam is applied to a workpiece to form a tapered hole the side wall of which is inclined. Next, the application of the ion beam is stopped, and then a material gas is introduced from the gas source to the upper surface of the workpiece from an oblique direction to cause gas molecules to be adsorbed to the upper surface of the workpiece and to the upper portion of the side wall of the hole. Next, introduction of the material gas is stopped, and then the ion beam is applied again to the region of the workpiece where the hole is formed. As a result, at the upper portion of the side wall of the hole, film formation occurs using the gas molecules as the material adsorbed to the side wall of the hole, and, at the bottom portion of the hole, etching of the workpiece occurs.

10 Claims, 13 Drawing Sheets

(56) References Cited

U.S. PATENT DOCUMENTS

| | | |
|---|---|---|
| 2010/0264111 A1 | 10/2010 | Makarov |
| 2013/0209701 A1 | 8/2013 | Suzuki |
| 2013/0224889 A1* | 8/2013 | Koyama .............. H01J 37/3178 438/4 |
| 2015/0079796 A1* | 3/2015 | Chandler ............ H01J 37/3056 438/707 |
| 2015/0369710 A1 | 12/2015 | Fuller et al. |

* cited by examiner

11 : WORKPIECE
HO : HOLE
IB : ION BEAM
RG : MATERIAL GAS
RM : GAS MOLECULE

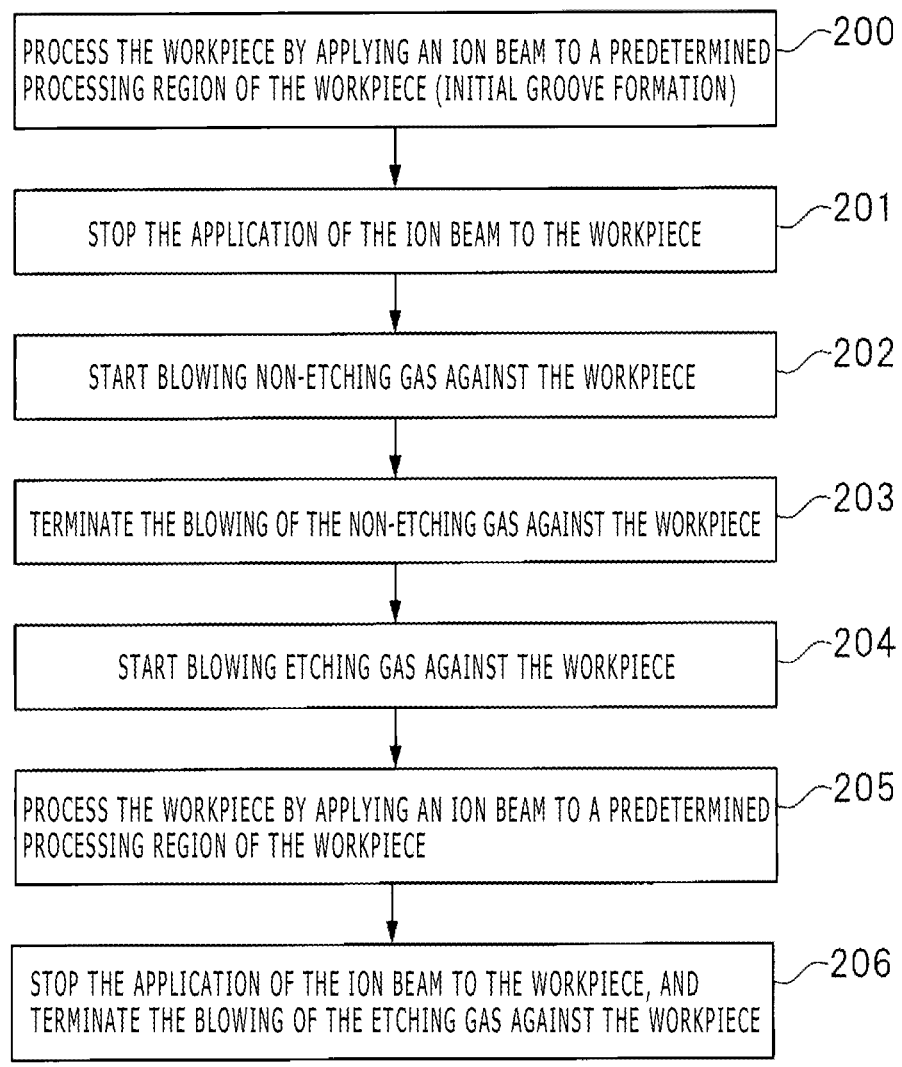

MICROSTRUCTURE PROCESSING METHOD AND MICROSTRUCTURE PROCESSING APPARATUS

CROSS-REFERENCE TO RELATED APPLICATION

The present application claims priority from Japanese Patent Application No. 2016-119491 filed on Jun. 16, 2016, the content of which is hereby incorporated by reference to this application.

BACKGROUND OF THE INVENTION

1. Field of the Invention

The present invention relates to a microstructure processing method and a microstructure processing apparatus.

2. Description of the Related Art

U.S. Pat. No. 5,683,547 discloses a related-art technique of the present technical field. The above-mentioned publication discloses a charged beam processing method according to which etching processing is performed on a workpiece by using a gas group as the reaction processing gas consisting of a mixture of a plurality of reaction processing gasses.

A processing technique employing a focused ion beam (FIB) device is regarded as a promising technique as a manufacturing technique for microstructures, such as micro electro mechanical systems (MEMS). To attain desired device characteristics in a microstructure, however, there are cases where additional processing has to be further performed on the microstructure manufactured by using an FIB. In such cases, a microstructure of a desired structure is formed by cutting a part of the previously manufactured microstructure or by adding a member thereto.

When, however, a groove is formed by cutting a part of the microstructure by using the FIB device, it can happen that the side wall of the groove is inclined, resulting in the formation of a tapered groove in sectional view. Thus, the technique has a problem in that it is impossible to form a microstructure exhibiting desired device characteristics. The possible causes for the generation of the above-mentioned tapered shape may, for example, be that the opening width of the groove upper portion is enlarged due to the distribution of the intenseness of the ion beam (also referred to as a charged particle beam), or that the opening width of the groove lower portion is diminished due to the influence of re-attachments.

SUMMARY OF THE INVENTION

To solve the above problem, there is provided according to the present invention a microstructure processing method including the steps of: supplying a non-etching gas to a workpiece to cause the gas molecules of the non-etching gas to be adsorbed onto the surface of the workpiece; and applying an ion beam to the workpiece to perform etching on the workpiece. In the method, the processing shape of the workpiece is controlled by controlling the supply time of the non-etching gas.

Further, to solve the above problem, there is provided according to the present invention a microstructure processing apparatus including: an ion beam application mechanism for applying an ion beam to a workpiece; a gas introduction mechanism for supplying a gas to the workpiece; and a control mechanism for controlling the ion beam application time and the gas supply time. In the apparatus, the application of the ion beam and the supply of the gas are alternately executed.

According to the present invention, it is possible to achieve an improvement in terms of the shape controllability in the processing of the microstructure.

The other problems, constructions, and effects will become apparent from the following description of preferred embodiments.

BRIEF DESCRIPTION OF THE DRAWINGS

FIG. 9 is a flowchart illustrating the operation of the FIB device according to embodiment 2;

DESCRIPTION OF THE PREFERRED EMBODIMENTS

Figure 1:
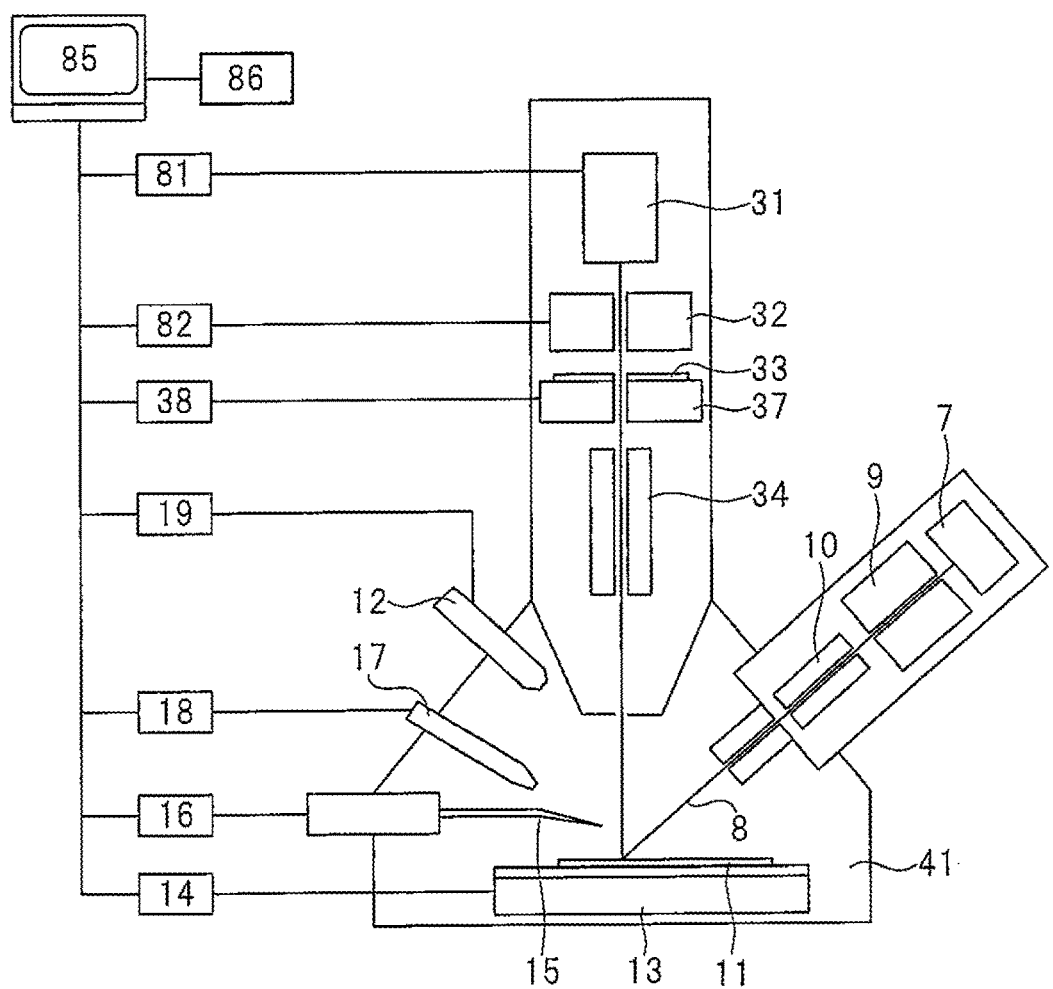
FIG. 1 is a diagram schematically illustrating an FIB device according to embodiment 1.

In the following, embodiments of the present invention will be described in detail with reference to the drawings. In all the drawings for illustrating the embodiments, the same members are indicated by the same reference numerals on principle, and a redundant description thereof will be left out.

The following description will be divided into a plurality of sections or embodiments as appropriate and as needed. Except for the cases particularly indicated, however, they are not unrelated to each other; one section or embodiment may serve as a modification example, application example, detailed description, supplementary description, etc. of apart or the whole of the other section or embodiment. Further, in the following embodiments, reference to the number (including the number, numerical value, amount, and range) of components should not be construed restrictively except for the cases particularly specified and the cases where a specific number is to be obviously treated restrictively from the viewpoint of principle; it may be equal to or more or equal to or less than a specific number.

Further, in the following embodiments, the components (including the component steps) are not always indispensable except for the cases where particularly specified and where they are obviously indispensable from the viewpoint of principle. Similarly, in the following embodiments, reference to the shape, position relationship, etc. of the components should be construed as including what is substantially approximate or similar to the shape, etc. thereof except for the cases where particularly specified and where they are to be obviously regarded as not such from the viewpoint of principle. This also applies to the number, etc. described above (including the number, numerical value, amount, and range).

In the following, the embodiments will be described in detail with reference to the drawings. In all the drawings for illustrating the embodiments, the members of the same function are indicated by the same or related reference numerals, and a redundant description thereof will be left out. In the case where there exist a plurality of similar members (portions), symbols may be added to a general reference numeral to indicate individual or specific portions. In the following embodiments, the description of the same or similar portions is not repeated on principle except when that is particularly necessary.

Further, in the sectional views and the plan views, the sizes of the portions do not correspond to those of the actual device; in order to make the drawings easier to see, there are cases where specific portions are depicted to be relatively large. Further, also when the sectional views correspond to the plan views, in order to make the drawings easier to see, there are cases where specific portions are depicted to be relatively large.

Embodiment 1

In the following, a MEMS manufacturing method according to embodiment 1 will be described. In the following description, the structure of the MEMS before processing will be referred to as the "starting structure" and the structure of the MEMS after processing will be referred to as the "desired structure."

<<Regarding the Processing Apparatus>>

First, the processing of the MEMS is performed by employing, for example, the FIB device shown in FIG. 1. FIG. 1 is a schematic view of the FIB device according to embodiment 1.

The FIB device has a vacuum container 41, and, in the vacuum container 41, there is arranged an ion beam application system composed of an ion source 31 emitting ions, a condenser lens 32, a beam restriction aperture 33, an ion beam scanning polariscope 34, an aperture rotation mechanism 37, etc. The ions emitted from the ion source 31 include, for example, gallium ions or xenon gas.

Further, there is arranged an electron beam application system composed of an electron gun 7, an electronic lens 9 focusing an electron beam 8 emitted from the electron gun 7, an electron beam scanning polariscope 10, etc. Further, there are arranged a workpiece 11, a secondary particle detector 12, a specimen stage 13, a probe (manipulator) 15, a gas source 17, etc. The gas source 17 introduces into the vacuum container 41 a non-etching gas (also referred to as the material gas, source gas, or deposition gas) or an etching gas for promoting the etching of the workpiece 11. The gas source 17 is equipped with a gas gun allowing angle control by a movable mechanism.

Further, as devices for controlling the FIB device, there are arranged a specimen stage control device 14, a manipulator control device 16, a gas source control device 18, a secondary particle detector control device 19, an aperture rotation control mechanism 38, an ion source control device 81, a lens control device 82, a computation processing device 85, a storage device storing a database 86, etc.

The specimen stage 13 is equipped with a linear movement mechanism for movement in two orthogonal directions in the specimen placing plane, a linear movement mechanism for movement in a direction perpendicular to the specimen placing plane, an in-specimen-placing-plane rotation mechanism, and an inclination mechanism having an inclination axis in the specimen placing plane, and the control of these mechanisms is conducted by the specimen stage control device 14 in accordance with a command from the computation processing device 85.

The computation processing device 85 is equipped, for example, with information input means through which the apparatus user inputs necessary information, and a display displaying an image generated based on a detection signal of the secondary particle detector 12, information input through the information input means, etc.

The database 86 stores various items of data related, for example, to the workpiece 11. Further, the database 86 stores the process flow when the workpiece 11 is processed and various items of data such as process recipe; also when the workpiece 11 of the starting structure is processed to form the workpiece 11 of the desired structure, the requisite information is output from the database 86.

In the FIB device, the ions emitted from the ion source 31 are focused onto the workpiece 11 by the condenser lens 32 and an objective lens. The setting of the focusing condition is performed through input to the computation processing device 85. The diameter of the beam applied to the workpiece 11 is determined by image formation on the workpiece 11 using the ion source 31 as the light source, and by the aberration due to the lens. The aberration due to the lens increases when the opening of the beam restriction aperture 33 increases, resulting in an increase in the beam diameter.

When forming a hole or a groove or the like in a part of the workpiece 11, the FIB device applies an ion beam to the workpiece 11 to perform etching on the workpiece 11.

<<Processing of the Workpiece>>

The present embodiment 1 is characterized in that a hole or a groove or the like having a perpendicularly processed side wall is formed by alternately repeating the step of causing the gas molecules of the material gas (non-etching gas) to be adsorbed onto the workpiece and the step of applying an ion beam to perform etching on the workpiece. In the following, by way of example, the step of forming a hole in the workpiece will be described.

Figure 2A:
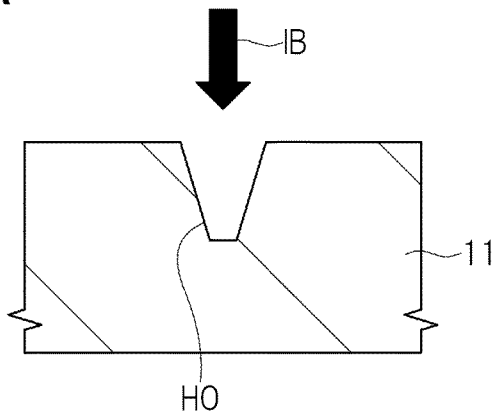
FIGS. 2A, 2B, and 2C are sectional views of the workpiece in the hole forming step according to embodiment 1.
Figure 2B:
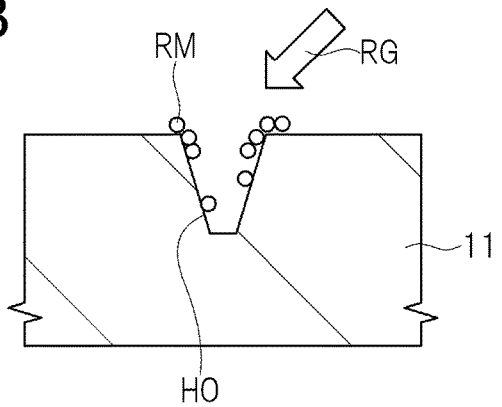
Figure 2C:
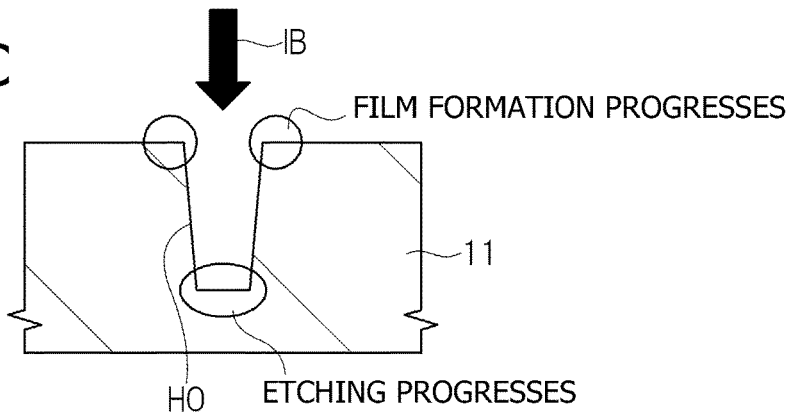

The outline of the step of forming a hole according to the present embodiment 1 will be described with reference to FIGS. 2A to 2C. FIGS. 2A, 2B, and 2C are sectional views of a workpiece in the hole forming steps according to embodiment 1.

[Step 1]

First, as shown in FIG. 2A, an ion beam IB is applied to the processing region of the workpiece 11 formed, for example, of silicon (Si), placed on the specimen stage of the FIB device (See FIG. 1), to perform etching on the workpiece 11. As a result, there is formed in the workpiece 11 a hole HO of a tapered shape having a side wall inclined in sectional view. That is, the hole HO is tapered like a cone in the depth direction from the upper surface of the workpiece 11, with the area of the bottom surface of the hole HO being smaller than the opening area of the upper surface of the workpiece 11. The beam application time (Dwell Time) is, for example, approximately 0.1 to 1 µs.

[Step 2]

Next, as shown in FIG. 2B, the application of the ion beam IB is stopped, and then a material gas RG is introduced from an oblique direction with respect to the upper surface of the workpiece 11 from a gas source with which the FIB device is equipped. The introduction time of the material gas RG is, for example, approximately 10 µs to 1 ms. The distance between the upper surface of the workpiece 11 and the distal end portion of a gas gun with which the gas source is equipped is, for example, approximately 100 µm.

By introducing the material gas RG from an oblique direction with respect to the upper surface of the workpiece 11, gas molecules RM of the material gas RG are adsorbed to the upper surface of the workpiece 11 and to the upper portion of the side wall of the hole HO, and a few gas molecules RM is adsorbed to the bottom portion of the hole HO. It is desirable for no gas molecules RM to be adsorbed to the bottom portion of the hole HO. This mode of adsorption of gas molecules RM can be controlled by the kind of the material gas RG, the blowing time and the blowing angle of the material gas RG from the gas source, etc. Thus, it is desirable that, as the material gas RG, there be selected the kind of gas the gas molecules RM of which are likely to be adsorbed to the upper portion of the side wall of the hole HO.

The material gas RG is a non-etching gas and it is desirable for the gas to be of the same material as the workpiece 11. The kinds of gas, however, are limited, so that there is selected the kind of gas containing gas molecules RM capable of preventing etching through the application of the ion beam IB.

Examples of the material gas RG include gases containing tetraethylorthosilicate; $Si(OC_2H_5)_4$ (TEOS), tetramethyl cyclotetrasiloxane; $(CH_4OSi)_4$ (TMCTS), hexacarbonyltungsten $(W(CO)_6)$, or phenanthrene $(C_{14}H_{10})$. This, however, should not be construed restrictively.

[Step 3]

Next, as shown in FIG. 2C, the ion beam IB is again applied to the processing region of the workpiece 11, where the hole HO is formed. As a result, at the upper portion of the side wall of the hole HO, there progresses a film formation using the gas molecules RM adsorbed to the side wall of the hole HO as the material, and, at the bottom portion of the hole HO, there progresses the etching of the workpiece 11; the inclination of the side wall of the hole HO is gentler than the inclination of the side wall of the hole HO shown in FIG. 2A, and there is formed a hole HO having side wall that is more akin to perpendicular.

Further, there are repeated the step of stopping the application of the ion beam IB and introducing the material gas RG from an oblique direction with respect to the upper surface of the workpiece 11 as described with reference to FIG. 2B ("step 2"), and the step of applying the ion beam IB to etch the workpiece 11 as described with reference to FIG. 2C ("step 3").

As a result, the inclination of the side wall of the hole HO becomes more akin to perpendicular, making it possible to form a hole HO having a side wall more akin to perpendicular.

<<Operation of the FIB Device>>

Figure 3:
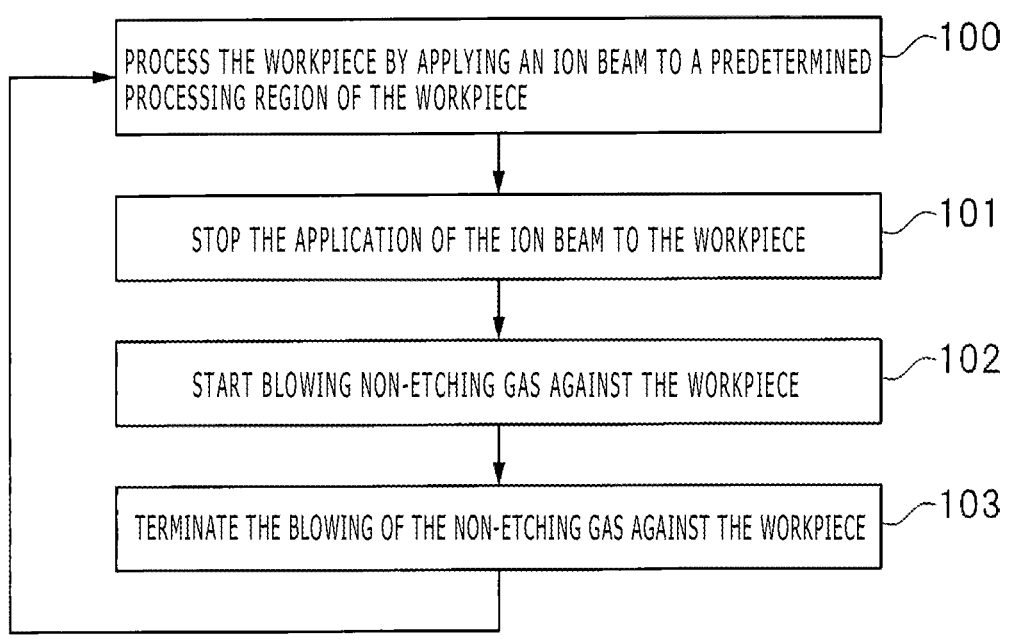
FIG. 3 is a flowchart illustrating the operation of the FIB device according to embodiment 1.
Figure 4A:
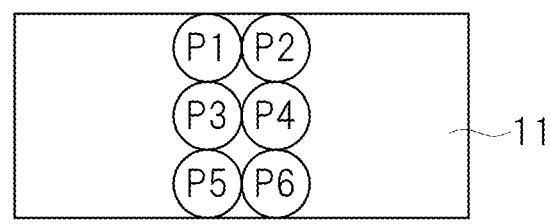
FIG. 4A is a plan view of the workpiece according to embodiment 1.
Figure 4B:
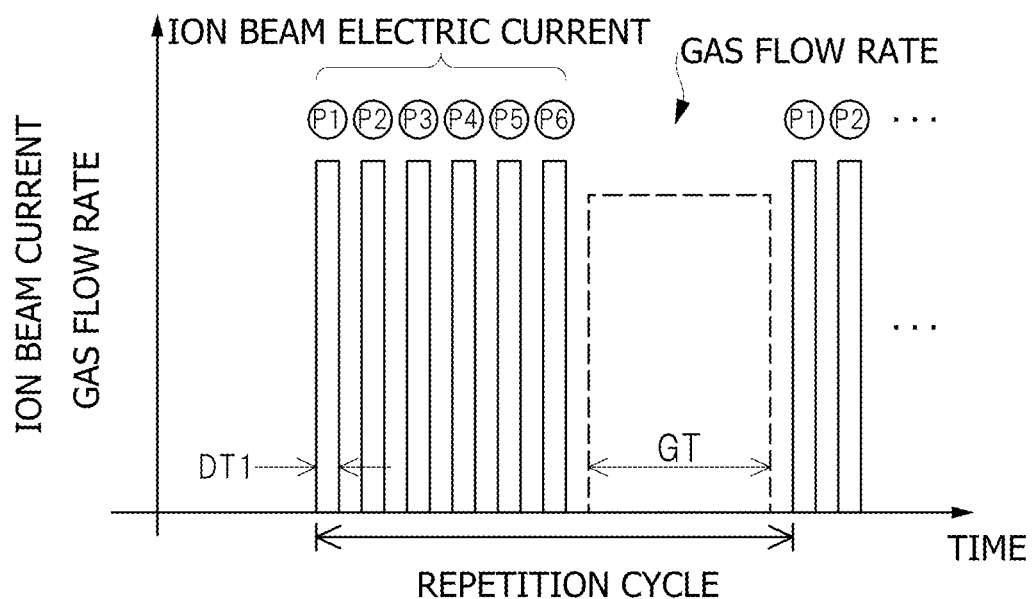
FIG. 4B is a graph illustrating chronological changes in an ion beam electric current and in gas flow rate according to embodiment 1.
Figure 5A:
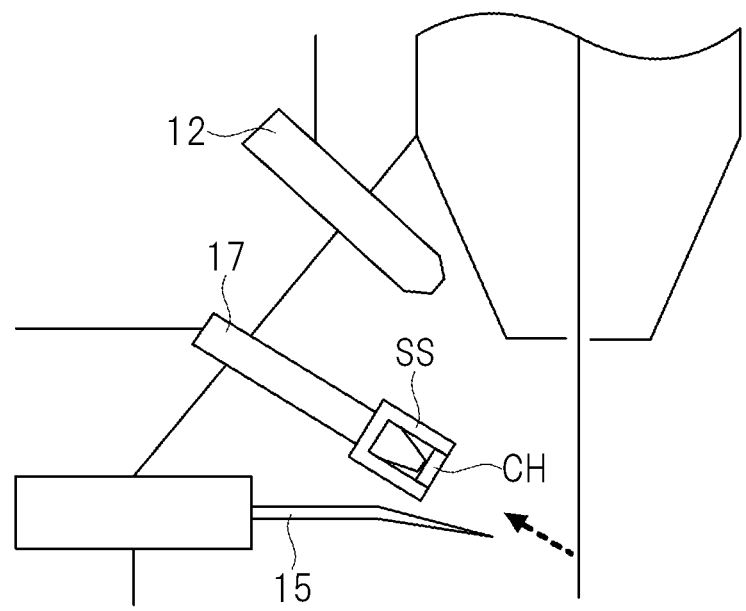
FIG. 5A is a schematic diagram illustrating the position of a chopper with which the FIB device of embodiment 1 is equipped.
Figure 5B:
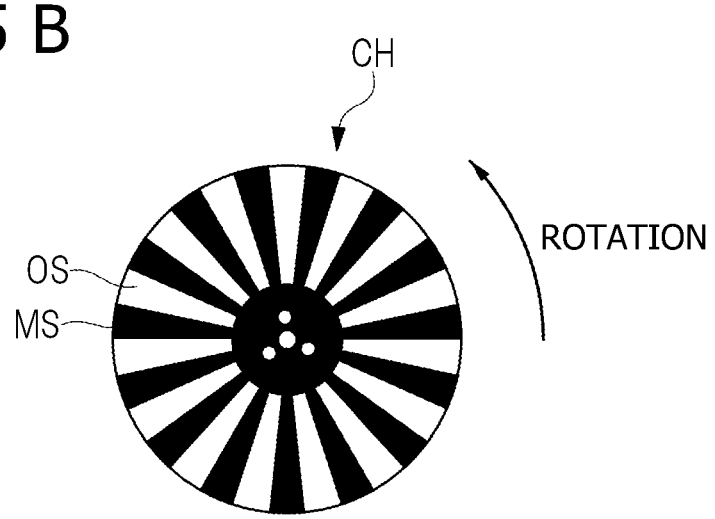
FIG. 5B is a plan view illustrating the chopper with which the FIB device of embodiment 1 is equipped.

The operation of the FIB device according to embodiment 1 will be described with reference to FIGS. 3, 4A, 4B, 5A and 5B. FIG. 3 is a flowchart illustrating the operation of the FIB device according to embodiment 1. FIG. 4A is a plan view of the workpiece in embodiment 1. FIG. 4B is a graph illustrating chronological changes in the ion beam electric current and the gas flow rate according to embodiment 1. FIG. 5A is a schematic diagram illustrating the position of a chopper with which the FIB device according to embodiment 1 is equipped. FIG. 5B illustrates the chopper with which the FIB device according to embodiment 1 is equipped, and is a plan view of the chopper as seen in the direction of the dotted line arrow of FIG. 5A.

In the following, the operation of the FIB device according to embodiment 1 will be described with reference to the flowchart of FIG. 3.

First, the workpiece 11 shown in FIG. 4A has six pixels: first through sixth pixels P1 through P6, and an ion beam is applied to each of these pixels in the order: the first pixel P1, the second pixel P2, the third pixel P3, the fourth pixel P4, the fifth pixel P5, and the sixth pixel P6 (step 100 in FIG. 3). As a result, etching is performed on each of the first through sixth pixels P1 through P6 of the workpiece 11 to form holes therein.

Here, each of the applications of ion beam corresponds to the step of "step 1" described with reference to FIG. 2A.

As shown in FIG. 4B, an ion beam is applied to the first pixel P1 for a predetermined beam application time DT1. The beam application time DT1 is, for example, approximately 0.1 to 1 µs. Similarly, an ion beam is applied to each of the second pixel P2, the third pixel P3, the fourth pixel P4, the fifth pixel P5, and the sixth pixel P6 in that order for the predetermined beam application time DT1.

Next, the application of the ion beam is stopped (step 101 in FIG. 3).

Next, as shown in FIG. 4B, a material gas is blown against the first through sixth pixels P1 through P6 from a direction oblique with respect to the upper surface of the workpiece 11 (step 102 in FIG. 3). As a result, gas molecules are adsorbed to the upper portion of the side wall of the hole of each of the first through sixth pixels P1 through P6, and a few gas molecules are adsorbed to the bottom portions of the holes.

Here, the blowing of the material gas corresponds to the step of "step 2" described with reference to FIG. 2B.

The blowing time GT of the material gas is, for example, approximately 10 µs to 1 ms. Further, while there are no particular restrictions regarding the material gas, examples of the material gas include TEOS, TMCTS, hexacarbonyltungsten, and phenanthrene.

The control as to whether or not the material gas is to be blown is effected through the opening and closing of a gas valve. Alternatively, a shutter may be provided between the gas gun with which the gas source is equipped and the workpiece 11, making it possible to effect control as to whether or not the material gas is to be blown against the workpiece 11 through the driving of the shutter.

As the shutter, there is employed, for example, a chopper CH shown in FIGS. 5A and 5B. The chopper CH is provided close to the distal end portion of the gas gun of the gas source 17 by means of a support portion SS. The chopper CH is alternately provided with opening portions OS and mask portions MS; when the material gas is blown, the opening portions OS are situated between the gas gun and the workpiece 11, and when no material gas is blown, the mask portions MS are situated between the gas gun and the workpiece 11.

Further, the gas flow rate of the material gas, the blowing time of the material gas, the angle of the gas gun, etc. are controlled, whereby gas molecules are adsorbed to the upper surface of the workpiece 11 and the upper portions of the side walls of the holes, and no gas molecules are adsorbed to the bottom portions of the holes.

Next, the blowing of the material gas is stopped (step 103 of FIG. 3).

Next, an ion beam is applied to each of the six pixels P1 through P6, shown in FIG. 4A, of the workpiece 11 in the order of: the first pixel P1, the second pixel P2, the third pixel P3, the fourth pixel P4, the fifth pixel P5, and the sixth pixel P6 (step 100 of FIG. 3). As a result, in each of the first through sixth pixels P1 through P6, there progresses a film formation using the gas molecules adsorbed to the side wall of the hole at the upper portion of the side wall of each hole as the material, and there progresses the etching of the workpiece at the bottom portion of the hole.

Here, the application of each ion beam corresponds to the step of "step 3" described with reference to FIG. 2C.

As shown in FIG. 4B, an ion beam is applied to the first pixel P1 for a predetermined beam application time DT1. The beam application time DT1 is, for example, approximately 0.1 to 1 μs. Similarly, an ion beam is successively applied to each of the second pixel P2, the third pixel P3, the fourth pixel P4, the fifth pixel P5, and the sixth pixel P6 in that order for the predetermined beam application time DT1.

Next, the application of the ion beam is stopped (step 101 of FIG. 3).

After this, the material gas is blown against the upper surface of the workpiece 11 from a direction oblique to the upper surface of the workpiece 11 (step 102 and step 103 of FIG. 3).

From this onward, steps 100 through 103 of FIG. 3 (step 2 and step 3 mentioned above) are repeated, whereby it is possible to form a hole having a side wall akin to perpendicular in each of the first through sixth pixels P1 through P6.

Figure 6A:
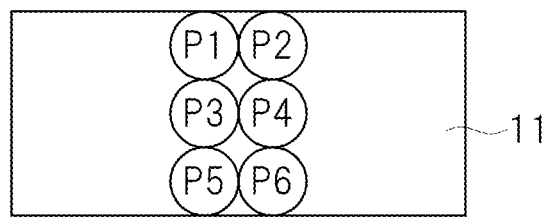
FIG. 6A is a plan view of the workpiece in a comparative example.
Figure 6B:
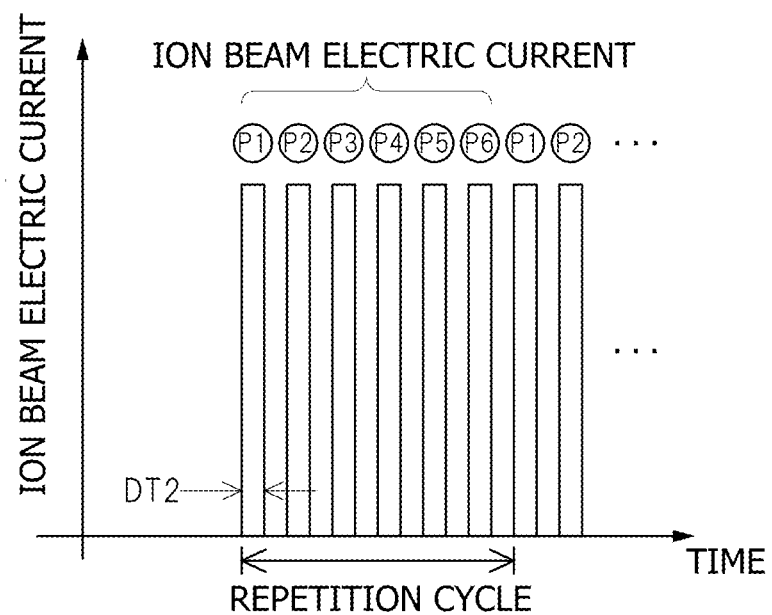
FIG. 6B is graph illustrating the chronological changes in the ion beam electric current in the comparative example.

As a comparative example, the operation of the FIB device prior to the application of the present invention as examined by the present inventors will be described with reference to FIGS. 6A and 6B. FIG. 6A is a plan view of the workpiece according to the comparative example. FIG. 6B is a graph illustrating chronological changes in the ion beam electric current and in the gas flow rate in the comparative example.

First, the workpiece 11 shown in FIG. 6A has six pixels: first through sixth pixels P1 through P6, and an ion beam is applied to each of these pixels in the order: the first pixel P1, the second pixel P2, the third pixel P3, the fourth pixel P4, the fifth pixel P5, and the sixth pixel P6. As a result, etching is performed on each of the first through sixth pixels P1 through P6 of the workpiece 11 to form holes therein.

Here, the application of each ion beam corresponds to the step of "step 1" described with reference to FIG. 2A.

As shown in FIG. 6B, an ion beam is applied to the first pixel P1 for a predetermined beam application time DT2. The beam application time DT2 is, for example, approximately 0.1 to 1 μs. Similarly, an ion beam is applied to each of the second pixel P2, the third pixel P3, the fourth pixel P4, the fifth pixel P5, and the sixth pixel P6 in that order for the predetermined beam application time DT2.

From this onward, step 1 mentioned above is repeated, whereby etching is performed on the workpiece 11 at each of the first through sixth pixels P1 through P6.

Through the operation of the FIB device according to the comparative example, however, there is formed a hole of a tapered shape with an inclined side wall in sectional view in each of the first through sixth pixels P1 through P6.

<<Software System Configuration>>

An example of the software system configuration of the FIB device according to the present embodiment 1 will be described with reference to FIG. 7.

Figure 7:
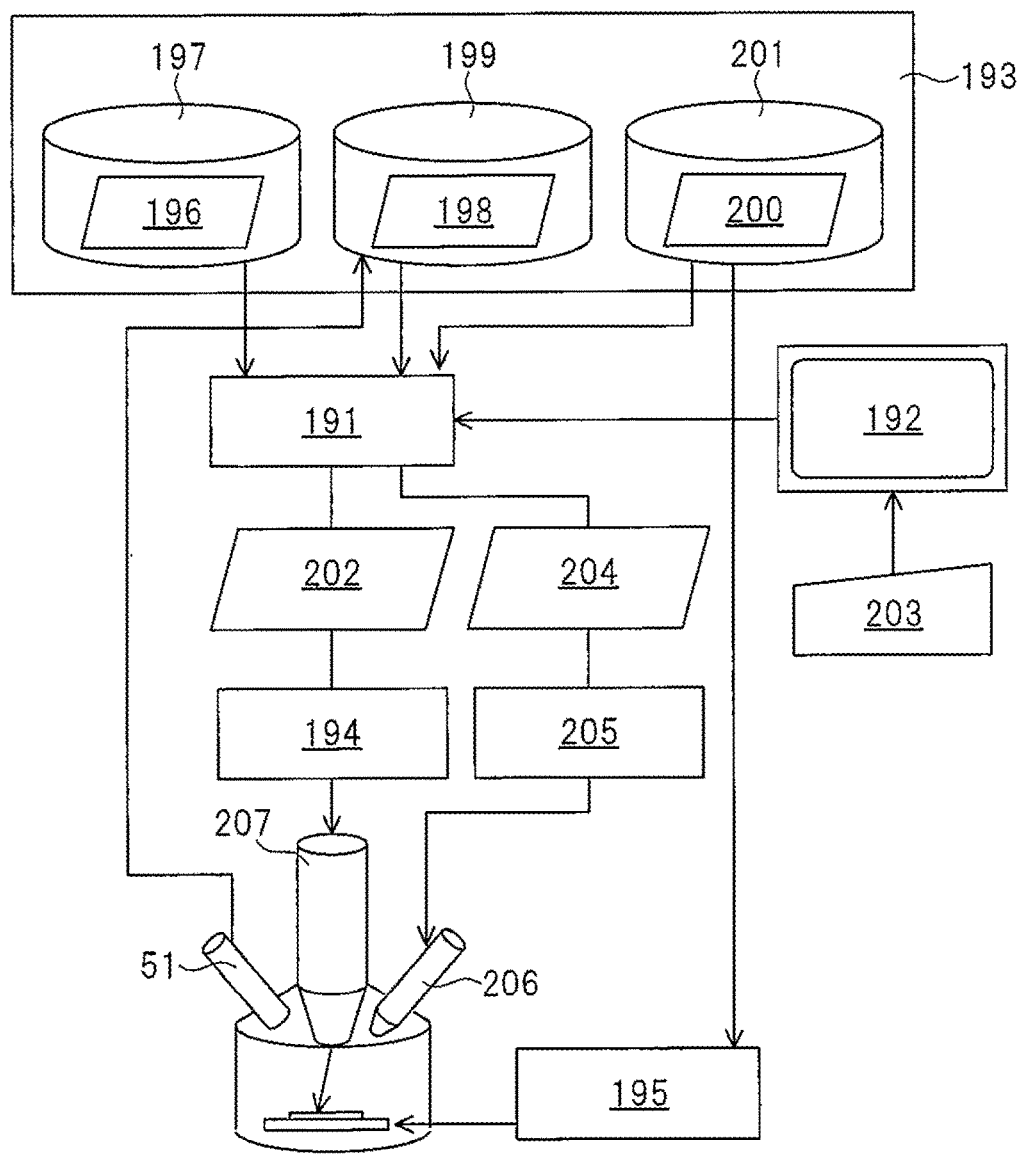
FIG. 7 is a diagram illustrating an example of the software system configuration of the FIB device in embodiment 1.

As shown in FIG. 7, the FIB device is equipped with a central control portion 191, a mode selection screen 192, a database 193, an ion beam control portion 194, a gas control portion 205, a specimen stage control portion 195, etc. The database 193 stores various items of data, and is equipped, for example, with a structure library 197, a computer-aided design (CAD) data portion 199, and a processing condition data portion 201. The structure library 197 stores member data 196 such as the specifications and addresses of the members; the CAD data portion 199 stores CAD data 198 such as actual measurement data on the shapes and dimensions of the members; and the processing condition data portion 201 stores processing condition data 200 such as the gas kind, gas introduction time sequence, etching condition, processing position, and material information.

For example, when a processing method as desired by the designer is selected and a mode is input (mode input 203) via the mode selection screen 192, the central control portion 191 selects the necessary data from the CAD data portion 199, the processing condition data portion 201, etc.

The sequence as shown in the selected processing method is executed by the central control portion 191, and the control information is transmitted to the ion beam control portion 194 and the gas control portion 205. On the basis of the control information (beam control data 202) transmitted to the ion beam control portion 194, the application condition, etc. of the ion beam applied to the workpiece from a beam lens barrel 207 is optimized, and, on the basis of the control information (gas control data 204) transmitted to the gas control portion 205, the condition such as the gas flow rate and gas introduction time of the material gas introduced to the workpiece from a gas source 206 is optimized. Further, positional information such as a mark is transmitted to the specimen stage control portion 195 from the processing condition data portion 201.

The data on a shape and a size of the workpiece as measured by an SIM (Scanning Ion Microscope) 51 or the like is transmitted to the CAD data portion 199, and, based on the data, the beam control data 202, the gas control data 204, etc. are obtained through conversion performed at the central control portion 191.

In this way, according to the present embodiment 1, the step of causing the gas molecules of a material gas (non-etching gas) to be adsorbed to the workpiece, and the step of applying an ion beam to perform etching on the workpiece, are alternately repeated, whereby a film formation progresses at the upper portion of the side wall of a hole or a groove, and the etching of the workpiece progresses at the bottom portion thereof. As a result, it is possible to form a hole or a groove or the like having a perpendicularly processed side wall.

Embodiment 2

A MEMS manufacturing method according to embodiment 2 will be described below.

In the step in which a workpiece is processed by applying an ion beam thereto, there are cases where an etching gas is introduced in order to achieve an improvement in terms of etching speed. In such cases, however, due to the introduction of the etching gas, etching may be performed on a region other than the processing portion of the workpiece, and this must be avoided.

<<Processing of the Workpiece>>

This method is characterized in that a region other than the processing portion of the workpiece is prevented from being etched by executing the step of causing the gas molecules of the non-etching gas to be adsorbed to the workpiece, and the step of applying an ion beam while introducing an etching gas. In the following, by way of example, a step of forming a groove in the workpiece will be described.

Figure 8A:
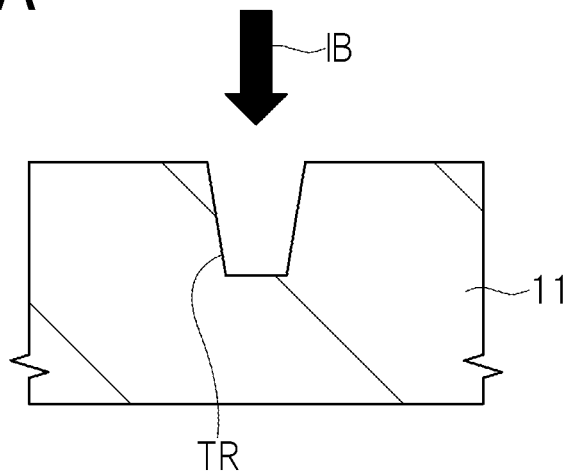
FIGS. 8A, 8B, and 8C are sectional views of the workpiece in the groove forming steps according to embodiment 2.
Figure 8B:
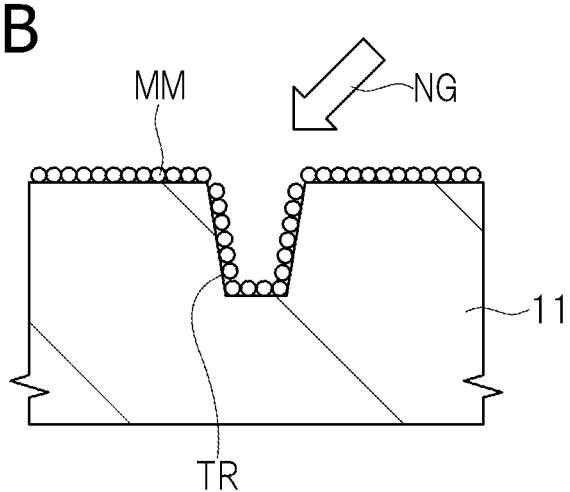
Figure 8C:
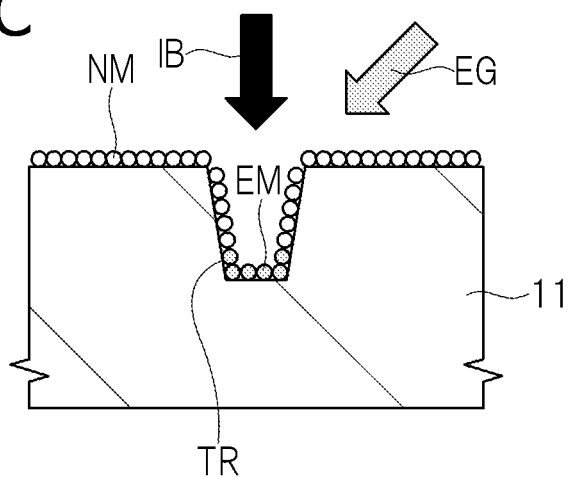

The outline of the groove forming step according to the present embodiment 2 will be described with reference to FIGS. 8A to 8C. FIGS. 8A, 8B, and 8C are sectional views of the workpiece in the groove forming step according to embodiment 2.

[Step 1]

First, as shown in FIG. 8A, an ion beam IB is applied to the processing region of the workpiece 11 formed, for example, of silicon (Si) placed on the specimen stage of the FIB device (See FIG. 1), and etching is performed on the workpiece 11. As a result, there is formed in the workpiece 11 a tapered groove TR with inclined side wall in sectional view.

[Step 2]

Next, as shown in FIG. 8B, after the application of the ion beam IB is stopped, a non-etching gas NG is introduced for a sufficiently long period of time from a gas source with which the FIB device is equipped. As a result, gas molecules NM of the non-etching gas NG is adsorbed to the upper surface of the workpiece 11 and the side wall and the bottom surface of the groove TR. As the non-etching gas NG, a gas including TEOS, TMCTS, hexacarbonyltungsten, or phenanthrene may be used. This, however, should not be construed restrictively.

[Step 3]

Next, as shown in FIG. 8C, the ion beam IB is applied to the bottom portion of the groove TR while introducing an etching gas EG from the gas source with which the FIB device is equipped. When the ion beam IB is applied, the gas molecules NM of the non-etching gas NG are consumed, and gas molecules EM of the etching gas EG are adsorbed. Thus, to the portion where the ion beam IB is applied and where the gas molecules NM of the non-etching gas NG are consumed, that is, to the bottom portion of the groove TR, there are adsorbed gas molecules EM of the etching gas EG, so that the etching in the vertical direction is accelerated, and the side wall of the groove TR approximate perpendicularity. On the other hand, gas molecules NM of the non-etching gas NG are adsorbed to the upper surface of the workpiece 11 and the side wall of the groove TR, to which no ion beam IB is applied, so that, in these regions, the adsorption of gas molecules EM of the etching gas EG does not occur.

As a result, the inclination of the side wall of the groove TR becomes akin to perpendicular, and it is possible to form a groove TR having a side wall akin to perpendicular.

When the diameter of the ion beam IB is large, the ion beam IB is applied to the upper surface of the workpiece 11 and the side wall of the groove TR; thus, it is necessary to employ an ion beam IB the diameter of which is smaller (of a small electric current) than the width of the groove TR, thus processing solely the bottom surface of the groove TR.

As the etching gas EG, a gas including $XeF_2$, $Cl_2$, $I_2$, $H_2O$, etc. may be used. This, however should not be construed restrictively.

Further, after the gas molecules NM and EM adsorbed to the upper surface of the workpiece 11 and the side wall and the bottom surface of the groove TR have been removed, there may be repeated the step of stopping the application of the ion beam IB and introducing the non-etching gas NG to the upper surface of the workpiece 11 and the side walls and the bottom surface of the groove (step 2), the step described with reference to FIG. 8B, and the step of applying the ion beam IB while introducing the etching gas EG to perform etching on the workpiece 11 (step 3), the step described with reference to FIG. 8C.

By repeating the above steps, the inclination of the side wall of the groove TR becomes more akin to perpendicular, making it possible to form a groove TR having side wall more akin to perpendicular.

<<Operation of the FIB Device>>

The operation of the FIB device according to embodiment 2 will be described with reference to FIG. 9. FIG. 9 is a flowchart illustrating the operation of the FIB device according to embodiment 2.

First, an ion beam is applied to the workpiece (step 200 of FIG. 9). As a result, the workpiece is etched and an initial groove is formed.

Here, the application of the ion beam corresponds to the step of "step 1" described with reference to FIG. 8A.

Next, the application of the ion beam is stopped (step 201 of FIG. 9).

Next, a non-etching gas is blown against the workpiece (step 202 of FIG. 9). By introducing the non-etching gas for a sufficiently long period of time, gas molecules of the non-etching gas are adsorbed to the upper surface of the workpiece and the side wall and the bottom surface of the groove.

Here, the blowing of the non-etching gas corresponds to the step of "step 2" described with reference to FIG. 8B.

While there are no particular restrictions regarding the non-etching gas, the non-etching gas is a gas including, for example, TEOS, TMCTS, hexacarbonyltungsten, or phenanthrene.

Next, the blowing of the non-etching gas is stopped (step 203 of FIG. 9).

Next, an etching gas is blown against the workpiece (step 204 of FIG. 9). While there are no particular restrictions regarding the etching gas, the etching gas is a gas including, for example, $XeF_2$, $Cl_2$, $I_2$, $H_2O$, etc.

Next, in the state in which the etching gas is being introduced, an ion beam is applied to the bottom portion of the groove (step 205 of FIG. 9). As a result, at the bottom portion of the groove, the workpiece is further etched.

Here, the blowing of the etching gas and the application of the ion beam correspond to the step of "step 3" described with reference to FIG. 8C.

Here, the beam diameter of the ion beam is smaller than the dimension of the bottom surface of the groove so that the side wall of the groove may not be etched. For example, there is applied an ion beam of a beam diameter smaller than the beam diameter of the ion beam applied in step 200 of FIG. 9.

Next, the application of the ion beam is stopped, and the blowing of the etching gas is stopped (step 206 of FIG. 9).

In the case where the bottom portion of the groove is to be further processed, steps 202 through 206 of FIG. 9 ("step 2" and "step 3" mentioned above) are repeated, whereby it is possible to form a groove having a side wall more akin to perpendicular.

In this way, according to the present embodiment 2, the etching of the processed portion of the workpiece (e.g., the bottom portion of the groove) progresses by conducting the step of causing gas molecules of the non-etching gas to be adsorbed to the workpiece, and the step of applying an ion beam while introducing the etching gas. As a result, it is possible to form a groove or the like having a perpendicularly processed side wall.

Embodiment 3

A MEMS manufacturing method according to the present embodiment 3 will be described below.

In the step of processing the workpiece by applying an ion beam thereto, there can be generated an in-plane variation not only in the inclination of the side wall of the groove as described in connection with the above embodiments 1 and 2 but also at the bottom surface of the groove, and this must be avoided.

<<Processing of the Workpiece>>

This method is characterized in that the in-plane variation at the bottom surface of the groove formed in the workpiece is suppressed by stacking together a plurality of materials differing in the film formation rate of the non-etching gas and in the etching rate of the ion beam application, and by processing the workpiece while controlling the film formation rate of the non-etching gas and the etching rate of the ion beam application of each material. In the following, by way of example, the step of forming a groove in the workpiece will be described.

Figure 10:
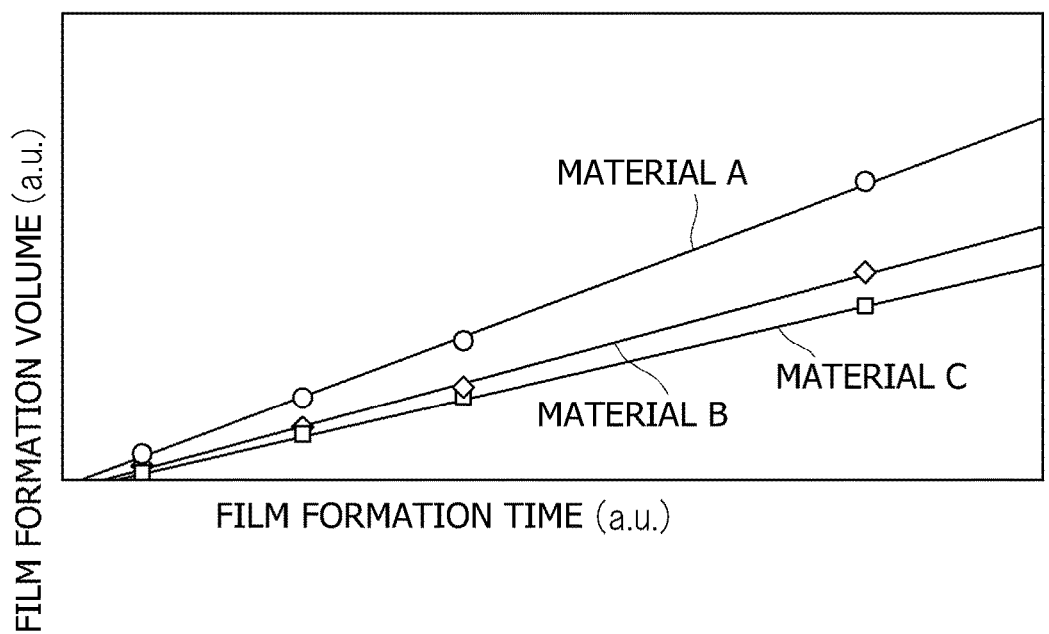
FIG. 10 is a graph illustrating the relationship between the film formation volume and the film formation time of tungsten films formed on various materials according to embodiment 3.
Figure 11A:
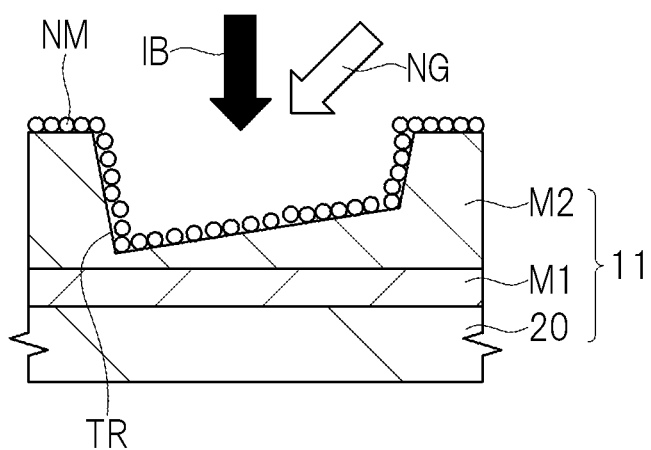
FIGS. 11A and 11B are sectional views of the workpiece in the groove forming step according a first example of embodiment 3.
Figure 11B:
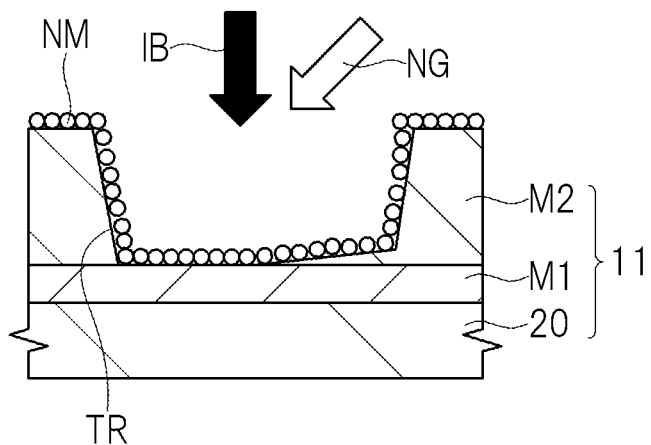
Figure 12A:
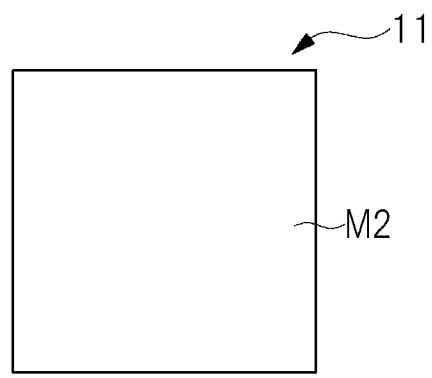
FIGS. 12A, 12B, and 12C are SIM images of the workpiece in the groove forming step according to a second example of embodiment 3.
Figure 12B:
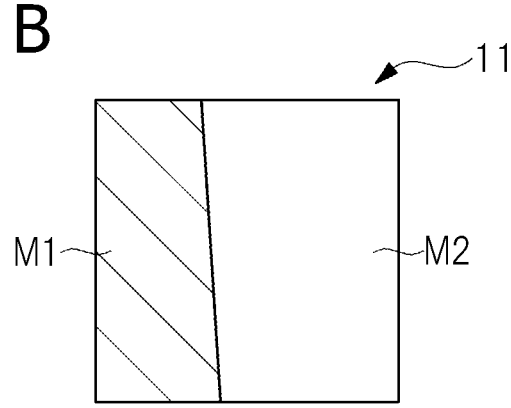
Figure 12C:
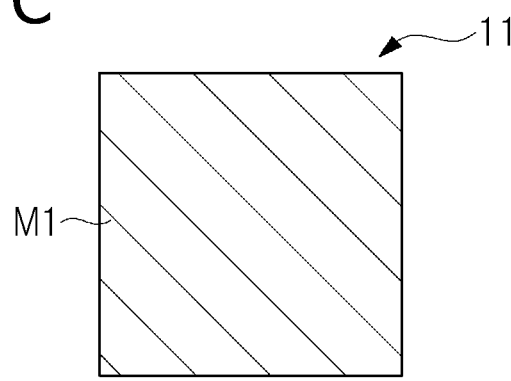

The outline of the groove forming step according to the present embodiment 3 will be described with reference to FIGS. 10, 11A, 11B, 12A, 12B and 12C. FIG. 10 is a graph illustrating the relationship between the film formation volume and the film formation time of a tungsten film formed on each of the different materials. FIGS. 11A and 11B are sectional views of the workpiece in the groove forming step according to a first example of embodiment 3. FIGS. 12A, 12B, and 12C are SIM images of the workpiece in the groove forming step according to a second example of embodiment 3.

As shown in FIG. 10, in the FIB device, the film formation rate of the non-etching gas including tungsten depends on the ground material forming the tungsten film.

In view of this, in embodiment 3, a first material and a second material differing from each other in the film formation rate of the non-etching gas and the etching rate of the ion beam application are successively stacked together, and a groove is formed mainly in the second material constituting the upper layer. The relationship between the film formation rate of the non-etching gas in the first material and the etching rate of the first material and the relationship between the film formation rate of the non-etching gas in the second material and the etching rate of the second material are controlled, whereby the in-plane variation at the bottom surface of the groove is suppressed.

First Example

The first example of the processing of the workpiece will be described below with reference to FIGS. 11A and 11B. In the first example, a groove is formed in the workpiece through the application of an ion beam.

First, as shown in FIG. 11A, the workpiece 11 is placed on the specimen stage of the FIB device (See FIG. 1). As the workpiece 11, there are stacked on a substrate 20 formed, for example, of silicon (Si) a first material M1 and a second material M2 differing from each other in the film formation rate of the non-etching gas NG and in the etching rate of the ion beam application. The first material M1 is, for example, a material A shown in FIG. 10, and the second material M2 is, for example, a material B shown in FIG. 10. That is, the film formation rate of the non-etching gas NG on the first material M1 is higher than the film formation rate of the non-etching gas NG on the second material M2. Further, the film formation incubation time of the non-etching gas NG on the first material M1 is shorter than the film formation incubation time of the non-etching gas NG on the second material M2.

Next, the ion beam IB is applied, and then the introduction of the non-etching gas NG is started. In this process, there is used, for example, a non-etching gas NG: in which the film formation rate on the first material M1 is higher than the film formation rate on the second material M2; in which the etching rate of the second material M2 is higher than the film formation rate on the second material M2; and in which the film formation rate on the first material M1 and the etching rate of the first material M1 are substantially the same or the etching rate of the first material M1 is lower than the film formation rate on the first material M1. For example, as the non-etching gas NG, a gas containing hexacarbonyltungsten may be employed.

When the etching of the second material M2 progresses, gas molecules NM are adsorbed to the upper surface of the second material M2 and the side walls and the bottom surface of the groove TR; since, however, the etching rate of the second material M2 is higher than the film formation rate on the second material M2, the groove TR is formed in the second material M2. However, due to variation in the etching of the second material M2, in-plane variation may be generated on the bottom surface of the groove TR formed in the second material M2.

As shown in FIG. 11B, however, as the etching of the second material M2 further progresses, when the etching attains the processing end point (the upper surface of the first material M1), the film formation rate on the first material M1 and the etching rate of the first material M1 become comparable with each other, making it possible to stop the progress of the etching of the first material M1. As a result, it becomes difficult for the etching to progress in the first material M1, and the etching is substantially terminated at the upper surface of the first material M1. Thus, in the groove TR formed in the second material M2, even if the bottom surface thereof exhibits variation at first, it is possible to form a bottom surface involving little in-plane variation at the upper surface of the first material M1.

Second Example

The second example of the processing of the workpiece will be described below with reference to FIGS. 12A, 12B, and 12C. While in the first example described above the non-etching gas is constantly introduced while the second material M2 is being etched, it is not always necessary to constantly introduce the non-etching gas. For example, the FIB device is generally equipped with a mechanism allowing SIM observation of the upper surface image of the workpiece while the workpiece is being processed. In view of this, by controlling the SIM observation in conjunction with the gas introduction mechanism, it is possible to shorten the gas introduction time.

As shown in FIG. 12A, the workpiece 11 is placed on the specimen stage of the FIB device (See FIG. 1). In the workpiece 11, the first material M1 and the second material M2 described in connection with the first example are stacked on a substrate formed, for example, of silicon (Si).

Next, an ion beam IB is applied to perform etching on the second material M2. In this process, no non-etching gas is introduced. It is possible to SIM-observe how the etching is being performed on the second material M2.

Next, as shown in FIG. 12B, when, as the etching of the second material M2 progresses, the first material M1 is exposed in a part of the workpiece 11 due to variation in the etching, a non-etching gas is introduced. Due to the material contrast in the SIM image, even during the etching, it is possible to observe in real time how the first material M1 is exposed. In view of this, the SIM observation is performed in conjunction with the gas introduction mechanism, whereby the introduction of the non-etching gas is started when it is detected that the first material M1 has been partially exposed in the SIM image.

Next, as shown in FIG. 12C, the introduction of the non-etching gas is stopped when it is detected in the SIM image that the second material M2 has been entirely etched and that solely the first material M1 is exposed.

In this way, the non-etching gas is introduced only when the first material M1 is partially observed in the SIM image, whereby it is possible to shorten the gas introduction time.

<<Operation of the FIB Device>>

Figure 13:
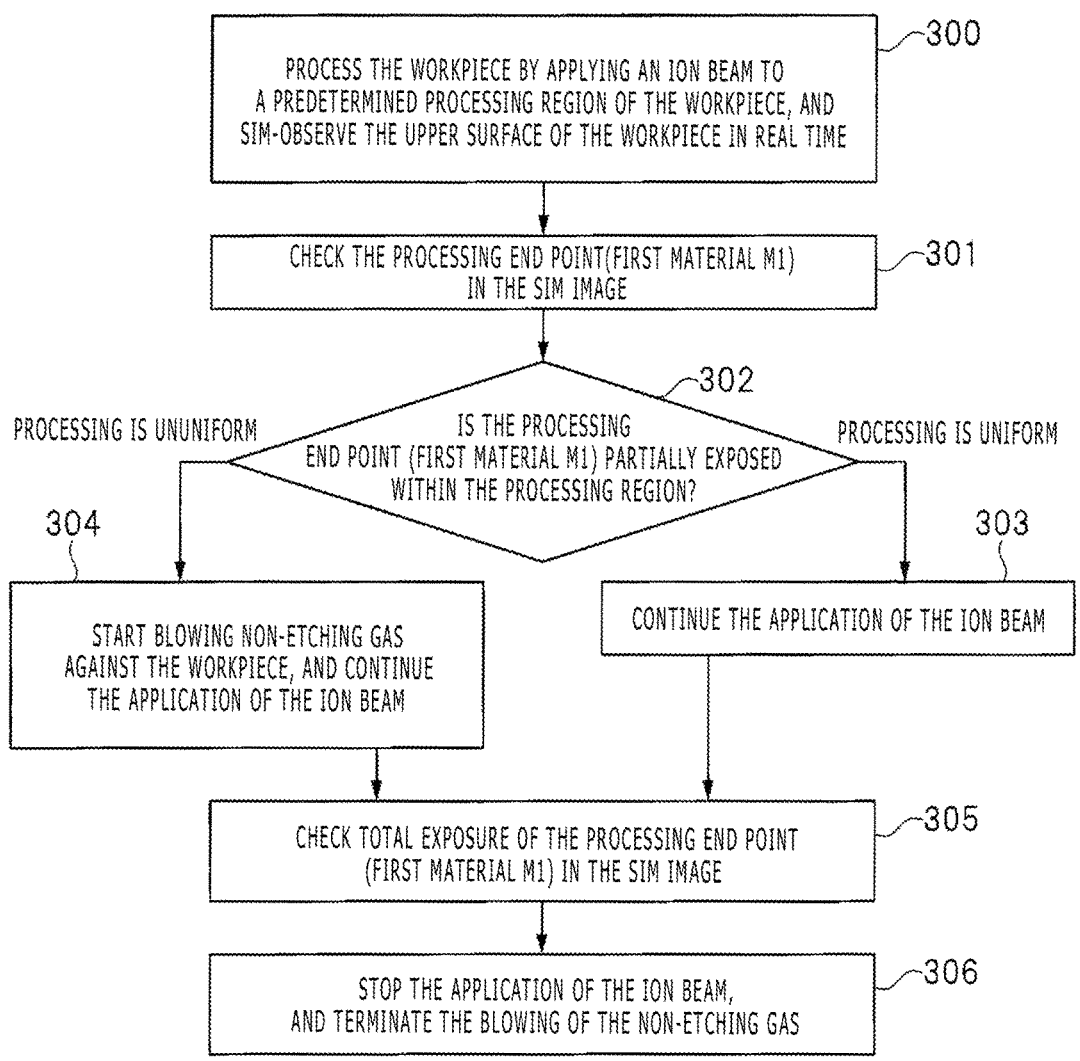
FIG. 13 is a flowchart illustrating the operation of the FIB device according to embodiment 3.

The operation of the FIB device according to embodiment 3 will be described with reference to FIG. 13. FIG. 13 is a flowchart illustrating the operation of the FIB device according to embodiment 3, and corresponds to the second example described above.

First, an ion beam is applied to the workpiece (step 300 of FIG. 13). As a result, etching is performed on the processing region of the workpiece to form a groove therein. The upper surface of the workpiece is SIM-observed in real time.

Next, the processing end point is confirmed in the SIM image (step 301 of FIG. 13), and it is determined whether or not the first material of the processing region is partially exposed (step 302 of FIG. 13). Here, when the first material or the second material is observed in the entire processing region, it is determined that the etching is uniform, and the application of the ion beam is continued (step 303 of FIG. 13). In this case, no non-etching gas is introduced. On the other hand, when exposure of the first material is partially observed in the processing region, it is determined that the etching is uneven, and the blowing of the non-etching gas is started, with the application of the ion beam being continued (step 304 of FIG. 13).

Next, when, in the SIM image, the processing end point is confirmed, and exposure of the first material all over the processing region is observed (step 305 in FIG. 13), the application of the ion beam is stopped; and, in the case where the non-etching gas has been introduced, the blowing of the non-etching gas is terminated (step 306 of FIG. 13).

In this way, according to the present embodiment 3, there are stacked together a plurality of materials differing from each other in the film formation rate of the non-etching gas and in the etching rate of the ion beam, and the workpiece is processed while controlling the film formation rate of the non-etching gas and the etching rate of the ion beam of each material, whereby it is possible to suppress the in-plane variation at the bottom surface of the groove formed in the workpiece.

Although the present invention made by the inventors has been described in detail herein above on the basis of the embodiments, it goes without saying that the present invention is not restricted to the embodiments specifically described above but allows various modifications without departing from the scope of the gist of the invention.

For example, in the above-described example to which the present invention is applied a hole or a groove is formed in a part of previously manufactured MEMS, the present invention is also applicable to the step of newly manufacturing MEMS. Further, while in the above embodiments MEMS constitute an example of the microstructure, this should not be construed restrictively.

What is claimed is:

1. A microstructure processing method comprising the steps of:
    (a) applying an ion beam to a workpiece to form a hole having a tapered shape in the workpiece without supplying an etching gas to the workpiece;
    (b) stopping the application of the ion beam to the workpiece;
    (c) while the ion beam is not applied to the workpiece and without supplying the etching gas to the workpiece, supplying a non-etching gas to the workpiece at an oblique angle to an upper surface of the workpiece to cause the gas molecules of the non-etching gas to be adsorbed onto the upper surface of the workpiece and a sidewall of the hole;
    (d) stopping the supply of the non-etching gas to the workpiece; and
    (e) while the non-etching gas is not supplied to the workpiece, applying the ion beam to the workpiece to perform film formation using the adsorbed gas molecules and to perform etching on the hole to increase an inclination of the sidewall,
    wherein a processing shape of the workpiece is controlled by controlling a supply time of the non-etching gas.

2. The microstructure processing method according to claim 1, wherein,
    in the step (c), the gas molecules are adsorbed to the upper surface of the workpiece and the sidewall of the hole, and none of the gas molecules are adsorbed to a bottom of the hole; and
    in the step (e), the bottom of the hole undergoes etching.

3. The microstructure processing method according to claim 1, wherein
    the steps (b) to (e) are repeatedly executed.

4. The microstructure processing method according to claim 1, wherein,
    in the step (c), the supply time during which the non-etching gas is supplied to the workpiece is 10 µs or more and 1 ms or less.

5. The microstructure processing method according to claim 1, wherein
    the supply time of the non-etching gas is controlled through an opening and closing of a gas valve with which a gas source of the non-etching gas is equipped.

6. The microstructure processing method according to claim 1, wherein
    the supply time of the non-etching gas is controlled through an opening and closing of a shutter provided between a gas gun with which a gas source of the non-etching gas is equipped and the workpiece.

7. The microstructure processing method according to claim 1, wherein
    the non-etching gas includes Si(OC2H5)4, (CH4OSi)4, W(CO)6, or C14H10.

8. The microstructure processing method according to claim 1, wherein,
    in the step (c), the gas molecules are adsorbed to the entire upper surface of the workpiece; and in the step (e), the ion beam is applied to the workpiece while supplying the etching gas to the workpiece to perform etching on the bottom of the hole to which the ion beam is applied.

9. The microstructure processing method according to claim 8, wherein the etching gas includes $XeF_2$, $Cl_2$, $I_2$, or $H_2O$.

10. The microstructure processing method according to claim 1, wherein, in the step (e), etching is performed on the workpiece while observing an upper surface of the workpiece.

* * * * *